(12) United States Patent
Chen et al.

(10) Patent No.: US 7,902,527 B2
(45) Date of Patent: *Mar. 8, 2011

(54) APPARATUS AND METHODS FOR ION BEAM IMPLANTATION USING RIBBON AND SPOT BEAMS

(76) Inventors: Jiong Chen, San Jose, CA (US); Nicholas R. White, Manchester, MA (US)

( * ) Notice: Subject to any disclaimer, the term of this patent is extended or adjusted under 35 U.S.C. 154(b) by 141 days.

This patent is subject to a terminal disclaimer.

(21) Appl. No.: 12/194,515

(22) Filed: Aug. 19, 2008

(65) Prior Publication Data

US 2009/0189096 A1    Jul. 30, 2009

Related U.S. Application Data

(63) Continuation-in-part of application No. 11/759,876, filed on Jun. 7, 2007, now Pat. No. 7,675,050, and a continuation-in-part of application No. 11/209,484, filed on Aug. 22, 2005, now Pat. No. 7,462,843, and a continuation-in-part of application No. 11/123,924, filed on May 6, 2005, now Pat. No. 7,112,789.

(60) Provisional application No. 60/571,965, filed on May 18, 2004.

(51) Int. Cl.
*H01J 37/317* (2006.01)
*H01J 37/28* (2006.01)
*G21K 1/00* (2006.01)

(52) U.S. Cl. .............. 250/492.21; 250/492.2; 250/492.3; 250/396 R; 250/398; 250/281; 250/282

(58) Field of Classification Search ............. 250/492.21, 250/492.2, 492.3, 396 R, 398, 281, 282
See application file for complete search history.

(56) References Cited

U.S. PATENT DOCUMENTS

| | | | |
|---|---|---|---|
| 5,350,926 A | 9/1994 | White et al. | |
| 5,393,984 A | 2/1995 | Glavish | |
| 6,489,622 B1 | 12/2002 | Chen et al. | |
| 6,498,348 B2 | 12/2002 | Aitken | |
| 6,710,358 B1 | 3/2004 | Chen et al. | |
| 6,770,888 B1 | 8/2004 | Benveniste et al. | |
| 7,057,192 B2 | 6/2006 | Kaim et al. | |
| 7,112,789 B2 | 9/2006 | White et al. | |
| 7,326,941 B2 * | 2/2008 | Chen et al. | 250/492.21 |
| 7,462,843 B2 * | 12/2008 | Chen et al. | 250/492.21 |
| 7,675,050 B2 * | 3/2010 | Chen | 250/492.21 |
| 2005/0017202 A1 | 1/2005 | White | |

OTHER PUBLICATIONS

Nicholas R. White, et al., "The Control of Uniformity in Parallel Ribbon Ion Beams up to 24 Inches in Size", The American Institute of Physics, 1999, pp. 830-835.

* cited by examiner

*Primary Examiner* — Nikita Wells
(74) *Attorney, Agent, or Firm* — Sawyer Law Group, P.C.

(57) ABSTRACT

An ion implantation apparatus with multiple operating modes is disclosed. The ion implantation apparatus has an ion source and an ion extraction means for extracting a ribbon-shaped ion beam therefrom. The ion implantation apparatus includes a magnetic analyzer for selecting ions with specific mass-to-charge ratio to pass through a mass slit to project onto a substrate. Multipole lenses are provided to control beam uniformity and collimation. A two-path beamline in which a second path incorporates a deceleration or acceleration system incorporating energy filtering is disclosed. Finally, methods of ion implantation are disclosed in which the mode of implantation may be switched from one-dimensional scanning of the target to two-dimensional scanning.

26 Claims, 14 Drawing Sheets

APPARATUS AND METHODS FOR ION BEAM IMPLANTATION USING RIBBON AND SPOT BEAMS

CROSS-REFERENCE TO RELATED APPLICATIONS

Under 37 CFR 1.53(b) this application is a continuation-in-part of U.S. patent application Ser. No. 11/759,876, filed Jun. 7, 2007, entitled "APPARATUS AND METHODS FOR ION BEAM IMPLANTATION USING RIBBON AND SPOT BEAMS", and a continuation-in-part of U.S. patent application Ser. No. 11/209,484 filed Aug. 22, 2005, which is a continuation-in-part of application Ser. No. 11/123/924 filed May 6, 2005, entitled "HIGH ASPECT RATIO, HIGH MASS RESOLUTION ANALYZER MAGNET AND SYSTEM FOR RIBBON ION BEAMS", and which claims priority from Provisional Application 60/571,965 filed May 18, 2004, entitled "HIGH ASPECT RATIO, HIGH MASS RESOLUTION ANALYZER MAGNET FOR RIBBON ION BEAMS", all of which are incorporated herein by reference.

FIELD OF THE INVENTION

The present invention relates generally to an apparatus for performing ion implantation. Specifically, the present invention relates to an improved implantation apparatus and methods for performing a high/medium current ion implantation at different ion energies.

BACKGROUND OF THE INVENTION

Ion implantation is a ballistic process used to introduce into a target substrate atoms or molecules, generally referred to as dopants, to make materials with useful properties. Of particular interest, ion implantation is a common process used in making modern integrated circuits. Ion implantation may also be used for thin film deposition with controlled thickness and predefined surface properties for manufacturing optical or display devices such as flat panel displays.

FIG. 1 illustrates a conventional batch ion implantation system, of a general type which has been manufactured for about 30 years. The implantation system comprises an ion beam source 14 that forms an ion beam 13. Beam 13 is directed to impinge on a batch of target substrates 10 mounted on a disk-shaped target substrate holder 11. These elements are housed in a vacuum housing which is not shown. The disk-shaped substrate holder is spun about axis 12 (which is preferably parallel to the axis of beam 13) and translated horizontally so that the distance R between axis 12 and beam 13 is varied. In order to achieve a uniform dose of ions, the translation velocity is inversely proportional to the distance R.

In certain applications, particularly those using 300 mm wafers or larger substrates as the implantation target, it is advantageous to generate ion beams in the form of ribbon-shaped beams having high aspect ratios such that the cross-section of the beam is much larger in one dimension than the other. These ribbon beams are commonly used in ion implanter apparatus and implantation systems where a single workpiece such as a silicon wafer or flat panel display is moved in a single dimension through the ion beam. In these instances, the cross-section of the ribbon ion beam typically has one dimension that is larger than one dimension of the workpiece undergoing implantation. As a result, in one or more passes through the ion beam, a uniform dose of ions may be implanted into the workpiece.

In these applications, it is desirable that the ribbon beam have its ion trajectories moving in parallel and under careful control so as to present a uniform current density profile that is appropriate for the implantation of ions into semiconductor wafers or flat glass panels. It is also desirable that the ion beam be substantially free of undesirable species that may be present in the ion source feed material and/or in the materials of the source itself. For many years standard practice in the industry has been to use magnetic analysis to separate and reject any unwanted species or components from these ion beams. However, for large ribbon-shaped beams generally, this type of magnetic analysis and ion beam purification becomes evermore difficult and costly. This particular problem as well as the general state of the art of analyzing and transporting ribbon ion beams is reviewed in depth in White et al., "The Control of Uniformity in Parallel Ribbon Ion Beams Up to 24 Inches in Size," Applications of Accelerators in Science and Industry 1998, AIP, p. 830, 1999, the entire text of which is expressly incorporated by reference herein.

A type of ion implantation system for silicon wafers is represented by the Models SHC 80, VIISta-80, and VIISta HC ion implantation systems manufactured by Varian Semiconductor Equipment Associates of Gloucester, Mass. This system is illustrated in FIG. 2 which is adapted from FIG. 1 of U.S. Pat. No. 5,350,926, which is incorporated herein by reference. The system comprises an ion source 2 for generating an ion beam 1, an analyzing electromagnet 3, a resolving aperture 4, and a second electromagnet 5. A control unit 36 receives beam intensity information on line 36a from a beam profiler and sends control signals along line 36b to control multipole elements in magnet 3 or along line 36c to control a beam trimmer. Magnet 3 mass analyzes the ion beam. Magnet 5 expands the beam along the dispersive plane using magnetic fields in closed loop control to maintain the uniformity of the beam. The result is a ribbon-shaped ion beam 6 that is incident on target 7. Further details of the system of FIG. 2 are set forth in the '926 patent.

Due to the complex interactions between the ion beam and the magnetic field applied for beam expansion, this approach creates severe technical, practical, and process related problems that increase the total production cost of such equipment and lead to more complicated operation procedures for carrying out the ion implantation. In particular, the beam path through this system is relatively long, and at low energies and high beam currents it becomes increasingly difficult to control the uniformity of the ion beam and the angular variation within the beam with the precision required by certain commercial processes.

It is further desirable to obtain milliampere currents of ions at energies as low as 200 eV. The highest beam currents are obtained by decelerating the ion beam immediately prior to the target. However this practice has several known disadvantages. One disadvantage is that the deceleration tends to modify the trajectories, magnifying any angular errors and making control of uniformity in a ribbon beam more difficult. Another disadvantage is that a portion of the ions is neutralized by charge-exchange processes with residual gas atoms and molecules and, as a result, is not decelerated. These ions penetrate into the silicon much further than is intended, and this deep penetration of some of the dopant ions interferes with the intended process; furthermore, since it depends on system pressure within the vacuum system, it is difficult to maintain constant conditions from day to day, and the level of contamination is not sufficiently constant to be tolerated.

In another type of application, ion beams are accelerated after traversing a mass analyzer unit. This allows a smaller and less expensive magnetic analyzer to be used, however, some of the ions are neutralized and some molecular ions are fragmented by collisions between ions or residual gas molecules. As a result, the energies of these particles are not as desired, and the ion velocities may be higher or lower than the intended velocity, resulting in implantation to an inappropriate depth. These problems are well-known, and solutions are proposed in U.S. Pat. Nos. 6,489,622 B1 and 6,710,358 B1, which are incorporated herein by reference.

In general, it is common to extend the energy range of an implanter by accelerating or decelerating the ion beam once most of the beam transport and analysis has been accomplished; however it is desirable to remove contaminant ions with the wrong energy from the ion beam, whether the energy is too high or too low.

However, these types of ion implantation systems often are not a viable solution for performing serial mode implantation with a high-current, high-uniformity ion beam that has controllable shapes and sizes. There is a need in the art of integrated circuit fabrication to provide a new system configuration, for generating a high current ion beam that has improved uniformity without requiring additional components while reducing the production cost and simplifying the manufacturing processes.

SUMMARY OF THE INVENTION

One aspect of the present invention is an ion implantation apparatus comprising an ion source, an extraction assembly for extracting an ion beam through a divergent extraction-optics, a mass analyzer magnet and a beam density controller. The implantation apparatus further includes a target chamber in which is mounted a target for implantation. Illustratively, the target is a semiconductor wafer or flat panel display. The extraction-optics has a convex geometry to produce a beam that is diverging as it leaves the extraction-optics. The ion beam is shaped by the divergent extraction-optics and the beam density controller to have a relatively tall and narrow cross-section in which the longer dimension is located in the non-dispersive plane of the magnet. As the beam continues to travel, the beam continues to become taller as it continues to diverge such that when the ion beam reaches the target wafer, it has sufficient height to cover the entire diameter of the wafer. The apparatus for ion implantation further includes a Faraday beam current measurement device disposed in proximity to the target wafer for scanning across the longer transverse dimension of the ion beam to measure the beam uniformity and to provide the measurement data back to the beam density controller.

One aspect of the present invention is an ion implantation apparatus comprising an ion source, an extraction assembly for extracting an ion beam, a magnetic analyzer for separating unwanted ion species from a traveling ribbon ion beam, and a target chamber in which is mounted a target for implantation. Illustratively, the target is a semiconductor wafer or flat panel display, which is moved through the beam (optionally back and forth) along a single path.

The beam is ribbon shaped, with one dimension many times greater than the other, and the longer dimension is aligned with the non-dispersive plane of the magnetic analyzer, which comprises:

a central axis and intended arc pathway for a ribbon ion beam as it travels, said central axis having a curvilinear shape, an arc with a radius ranging between about 0.25 and 2 meters, and an angle of curvature ranging from not less than about 45 degrees to not more than 110 degrees of curvature;

an arcuate yoke construct encompassing said predetermined curvilinear central axis and surrounding said intended arc pathway for the continuous ribbon ion beam as it travels, said arcuate yoke construct being formed at least in part of a ferromagnetic material and comprising an arcuate wall structure having fixed dimensions and a substantially rectangular cross-section, two discrete open ends which serve as an entrance and exit for the traveling beam, and an internal spatial region of determinable volume which serves as a spatial passageway for the traveling beam;

a mirror symmetrical pair of loop-shaped coils set in parallel as an aligned array, (a) wherein each discrete coil of the pair in the aligned array (i) is an elongated complete loop comprised at least in part of electrically conductive material, (ii) is an elongated complete loop having two rounded and inclined discrete loop ends, each of which is bent in the same direction, and (iii) is an elongated complete loop formed as a set of multiple conductive segments placed in sequential series wherein each segment lies at a pre-chosen sequence position and individual angle orientation with respect to the central axis and intended arc pathway for the ribbon ion beam as it travels within said internal spatial region of said arcuate yoke construct, and (b) wherein the aligned array of two looped-shaped coils set in mirror symmetry (iv) presents a bend direction for the two rounded inclined ends of one looped-shaped coil which is opposite to the bend direction for the two rounded inclined ends of the other looped-shaped coil in the pair, (v) provides a central open spatial channel via the cavity volume of the closed loop in each of the two coils, said central open spatial channel extending from each pair of inclined rounded loop ends to the other over the linear dimensional distance of the array, (vi) is positioned within said internal spatial region along the interior surfaces of two opposing walls of said arcuate yoke construct such that one pair of oppositely bent inclined loop ends extends from and lies adjacent to each of the two open ends of said arcuate yoke construct, (vii) serves as limiting boundaries for said curvilinear central axis and intended arc pathway for the continuous ribbon ion beam as it travels in the gap space between said two loop-shaped coils after being positioned within said internal spatial region of said arcuate yoke construct. In order to create a magnetic field with good uniformity, without excessive stray field, the field is generated by at least two coils or symmetric sets of coils, which are of saddle shape, one above and one below the beam. The region of uniform field is bounded by the coil windings.

Another aspect of the present invention provides a single dipole magnet, which mass-analyzes the ion beam while allowing its major dimension to continue to diverge from the ion source in the direction of the dipole magnetic field. It can additionally use a lens to halt the divergence of the ion beam on reaching the requisite major dimensional size and collimate it, i.e. render it parallel. A suitable lens may use magnetic or electric fields, may generate a quadrupole field, and must have a beam passage of high aspect ratio to conform generally to the ribbon shape of the ion beam.

In certain circumstances such as when using high-current low energy beams it may not be possible to assure a ribbon beam that is sufficiently uniform. Another embodiment of this invention comprises an ion source, which generates a ribbon-shaped ion beam, a magnetic mass-analyzer, a focusing system for shaping the beam, and a processing station where a workpiece such as a silicon wafer or flat-panel can be mechanically moved through the ion beam. As the ion beam leaves the mass analyzer, a first lens, which can be a magnetic multipole lens comprising an array of pairs of coils arranged on a pair of ferromagnetic supports, can be operated in two modes. In a first mode, the currents in the coils of this multipole lens can be controlled responsive to a measurement of the ion beam profile to control the current density in this beam profile. The ion beam is allowed to continue as a ribbon-shaped beam whose major dimension exceeds a dimension of the workpiece. The workpiece is then translated through this ion beam along a single path, one or more times, to implant a desired uniform dose of ions into its surface. In a second mode, the currents in the coils of this first multipole lens are excited so as to generate a quadruple magnetic field which causes the ribbon ion beam to converge in its major dimension, thereby generating at a downstream location a beam spot which is smaller in both transverse dimensions than either dimension of the workpiece. The workpiece is then translated in a reciprocating path in two dimensions through the ion beam, so as to implant a uniform dose of ions into its surface by implanting a succession of partially overlapping stripes.

The second mode is likely to be advantageous when using high-current, low-energy beams (for example greater than 1 mA at energies below 3 keV) under which conditions space-charge and other effects make positive control of the uniformity of the current in a beam more difficult. The first mode requires slower motions and is likely to deliver higher processing throughput at energies where satisfactory control of the ion beam profile can be achieved. The currents in the multipole lens in either mode may be adjusted to fine-tune the beam current density profile of the beam, even though at low energy this control is insufficient to ensure a uniform implant in one pass with a ribbon beam. In the second mode, this may be valuable to approximate a smooth Gaussian beam profile. Without a smooth beam profile, the method of passing the workpiece in regular increments through the ion beam may cause detectable stripes of varying ion beam dose in the workpiece.

A further aspect of the invention provides a second lens after the first multipole lens, whose function is to collimate the ion beam. This is particularly important for the first operating mode, i.e. the ribbon-beam case, where systematic variation in the implant angle across the face of the workpiece would otherwise occur. It is also of value to reduce the range of angular variation in the ion beam in the second mode.

A further aspect of the invention provides an optional means of deceleration of the ion beam using a bent ion beam path, to deliver high beam currents at low energies while filtering out high-energy contaminants, for use in ion implantation in either the ribbon-beam or 2D scan beam modes. In accordance with this aspect of the invention, the beam is bent through an angle that differs by a small amount from standard conditions, then the ion beam is decelerated by means of a set of electrodes that superimpose two opposed successive sideways components of electric field on the deceleration field, so that the ion beam is deflected in an S-shaped bend, the deflections each amounting to an angle of at least 10 degrees, and providing a lateral displacement of several times the width of the ion beam. By providing beam stops on either side of the beam, the only ions transmitted are those with the correct charge and energy, so contaminants such as high-energy neutral atoms can be removed.

A further aspect of the invention provides an optional means of acceleration of the ion beam using a bent ion beam path to filter out low and/or high-energy contaminants, for use in ion implantation in either the ribbon-beam or 2D scan beam modes. In accordance with this aspect of the invention, the beam is bent to pass along a path offset from its final desired path, then the ion beam is accelerated by means of a set of electrodes that impose successively two opposed sideways components of electric field on the acceleration field, so that the ion beam is deflected in an S-shaped bend, the deflections each amounting to an angle of at least 5 degrees, and providing a lateral displacement of several times the width of the ion beam. By providing beam stops on either side of the beam, the only ions transmitted are those with the correct charge and energy, so contaminants such as low-energy neutral atoms can be removed.

The apparatus and methods of the invention make it possible:

1. To generate a ribbon beam for ion implantation which is mass-analyzed efficiently with a single analyzing magnet in a short, relatively simple beamline with high resolving power;

2. To provide a second operating mode where the beam can be smaller than the target for implantation, and the target is scanned in a 2D pattern to accomplish uniform implantation;

3. To control the collimation of the ion beam and control variation in implantation angle over the surface of the target;

4. To provide a means of decelerating the ion beam in either implantation mode in a manner which eliminates the usual contamination by high-energy neutral atoms;

5. To provide a means of accelerating the ion beam in either implantation mode in a manner which eliminates the usual contamination by low and/or high-energy neutral atoms;

6. To provide a means of varying and controlling the current density in the ion beam.

BRIEF DESCRIPTION OF THE FIGURES

These and other objects and advantages of the present invention will be apparent to those of ordinary skill in the art in view of the following detailed description in which:

FIG. 9b depicts the details of an s-shaped acceleration region also suitable for use in the system of FIGS. 5a and 5b, in substitution for FIG. 9a.

DETAILED DESCRIPTION

The present invention relates generally to an apparatus for performing ion implantation. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
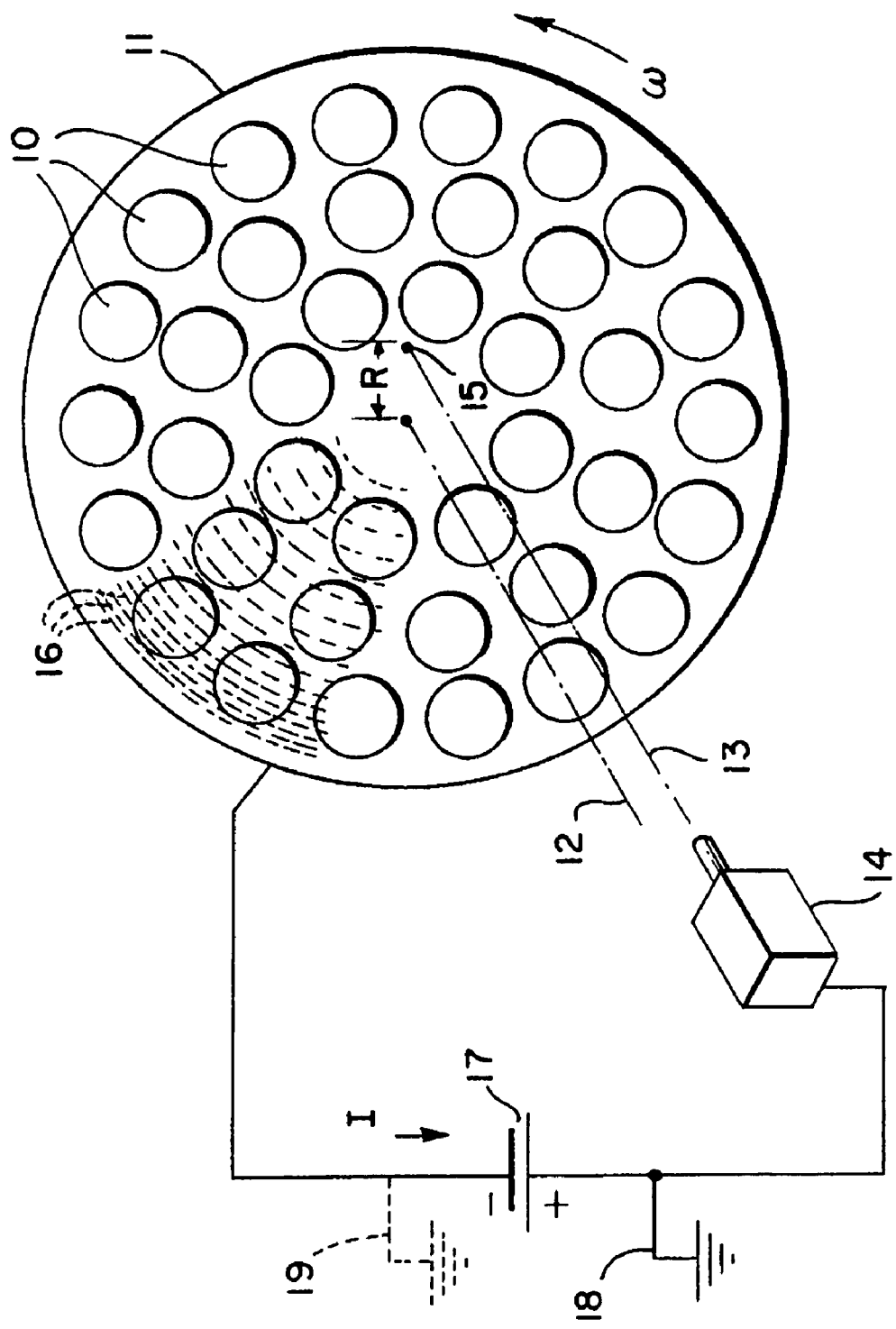
FIG. 1 is a functional block diagram of a conventional prior art batch ion implantation system in which a spinning disk holding implantation targets provides one dimension of motion, and translation of the disk provides a second dimension.
Figure 2:
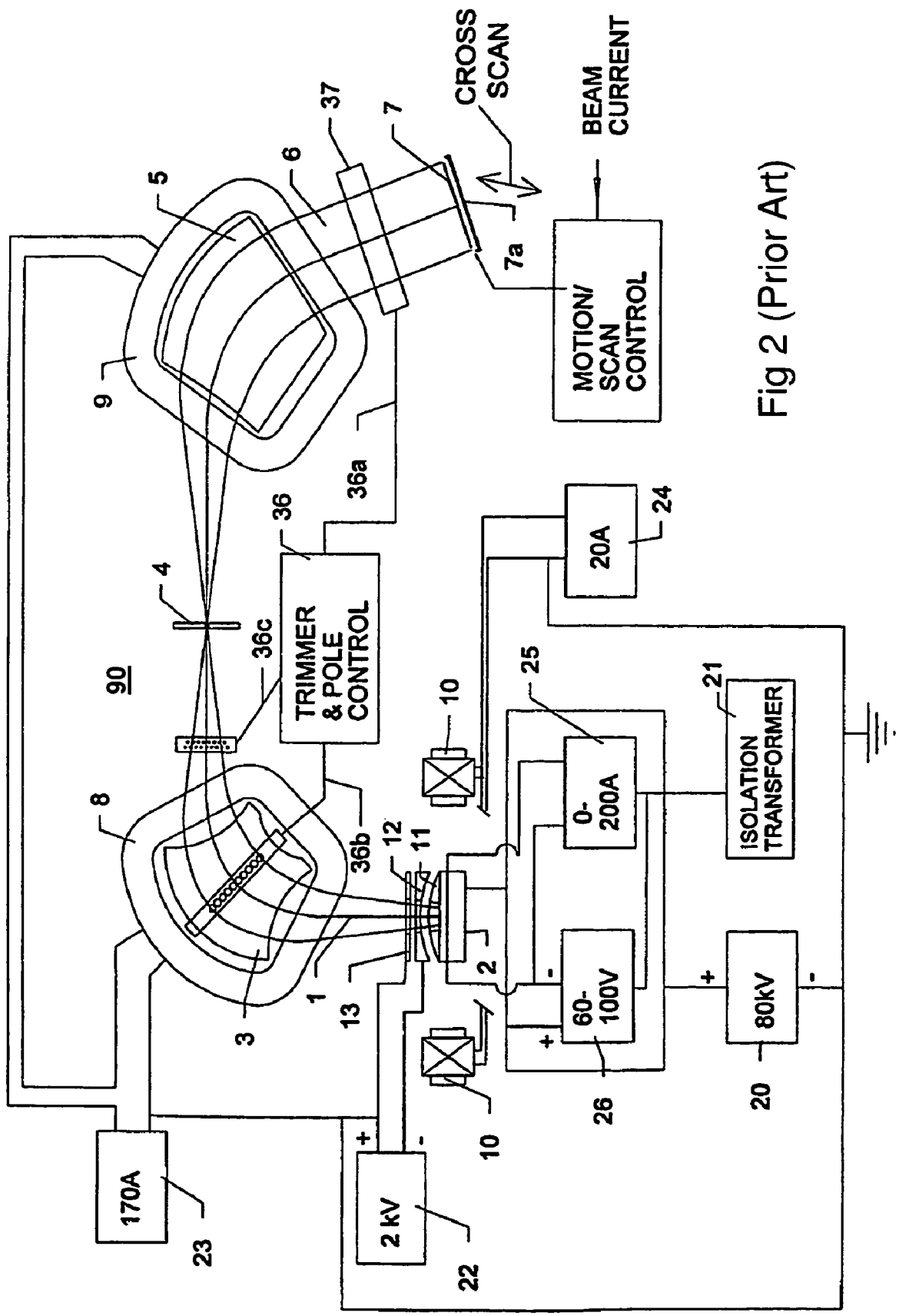
FIG. 2 is a functional block diagram of a prior art ribbon-beam implanter in which the implantation target is translated though the ribbon beam in one dimension.
Figure 3:
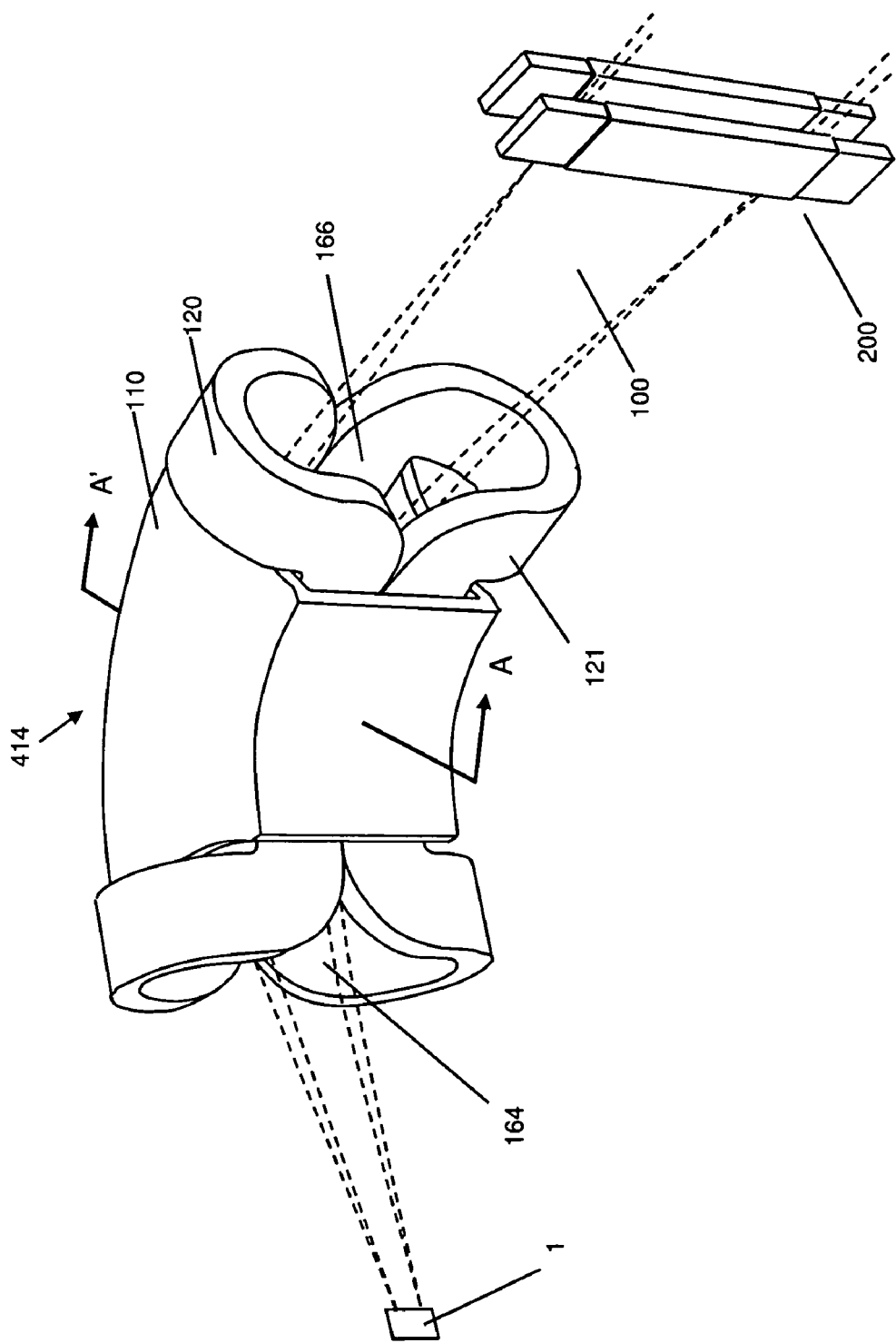
FIG. 3 is a perspective view of a ribbon-beam system according to the present invention in which the ion beam diverges through an analyzer magnet and is then collimated by a lens.

FIG. 3 is a perspective view of a first embodiment of an ion implantation system of the present invention. The system comprises an ion source 102 that produces an ion beam 100 that emanates from a divergent extraction optics similar to those shown in FIG. 2, a mass analyzer magnet 414, and a collimator lens 200 As will be appreciated by those skilled in the art, these elements are housed in a vacuum enclosure (not shown). Magnet 414 comprises upper and lower coils 120, 121 and a yoke 110 with an entrance aperture 164 and an exit aperture 166. The magnet is curved over an arc of about 90 degree. The cross-section of the ion beam is relatively tall and thin and the longer dimension of the cross-section lies in the non-dispersive plane of magnet 444. The ion beam is slightly divergent upon exiting the extraction electrode; and as the beam travels along the beam path, it continues to become taller as the beam rays continue to diverge such that when it approaches the target (which may be a semiconductor wafer, for example) its major dimension is larger than the implantation target's size, i.e. 200 or 300 mm for silicon wafers. The collimator lens 200 halts the divergence and renders the beam parallel, controlling variation of implant angle across the implanted surface of the target.

Figure 4A:
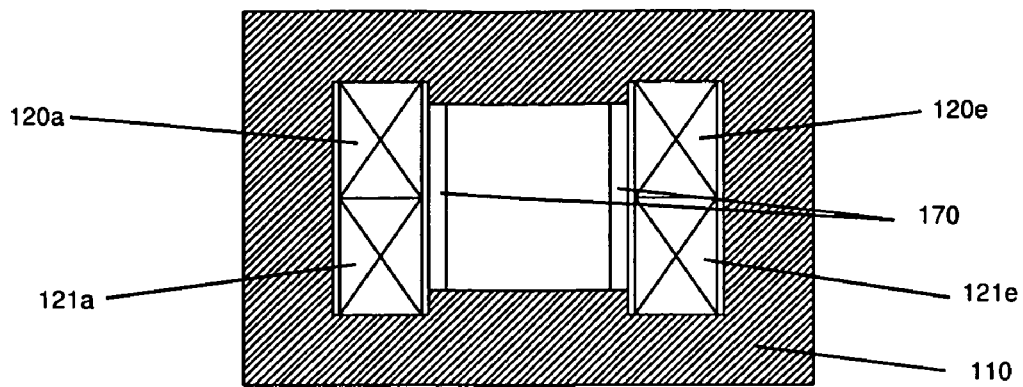
FIGS. 4a, 4b and 4c illustrate successive cross sections of a magnet which is tailored to fit an expanding ribbon beam.
Figure 4B:
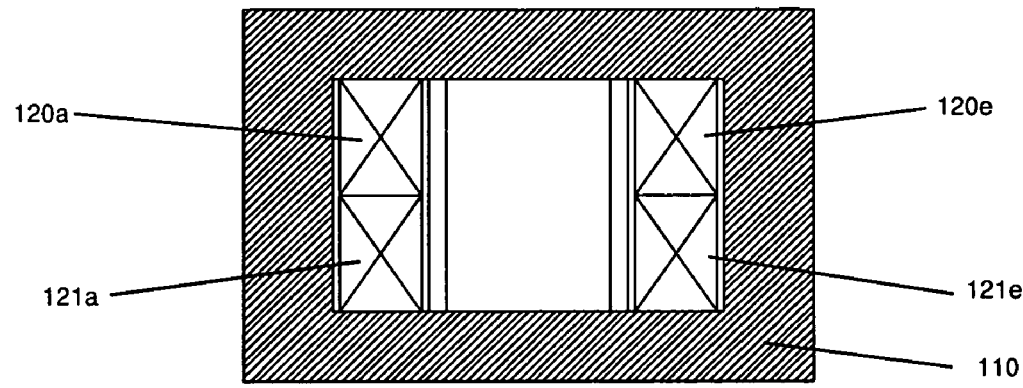
Figure 4C:
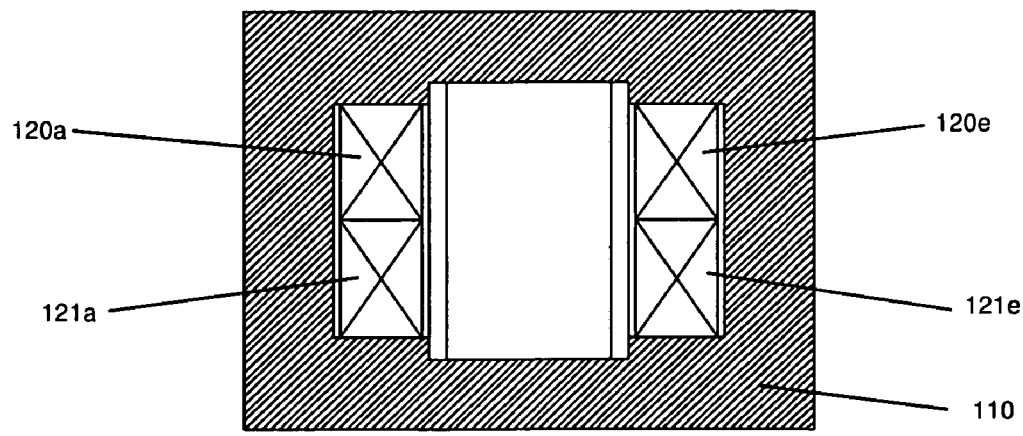

The analyzer magnet in FIG. 3 has a central passageway for the beam that has a top and bottom that are parallel from entrance aperture 164 to exit aperture 166. Thus, a cross-section of the magnet taken along lines A-A' of FIG. 3 at any point along the radius of curvature of the magnet is the same. However the ion beam is diverging. In a second embodiment, the construction of the magnet is modified as illustrated by the three cross sections in FIGS. 4a, b, and c so that the height of the beam passage through the magnet increases as the beam expands. In particular, as shown in FIG. 4a, which depicts a cross-section closest to the entrance aperture 164 of the magnet, the height of the central passageway 160 is smallest. As shown in FIG. 4c, which depicts a cross-section closest to the exit aperture 166, the height of the central passageway is largest; and as shown in FIG. 4b which depicts a cross-section between those of FIGS. 4a and 4c, the height is intermediate that of the other two. As a result, the beam occupies a large fraction of the volume in which field is generated, and there is less waste of power in the generation of unused magnetic field.

Figure 6:
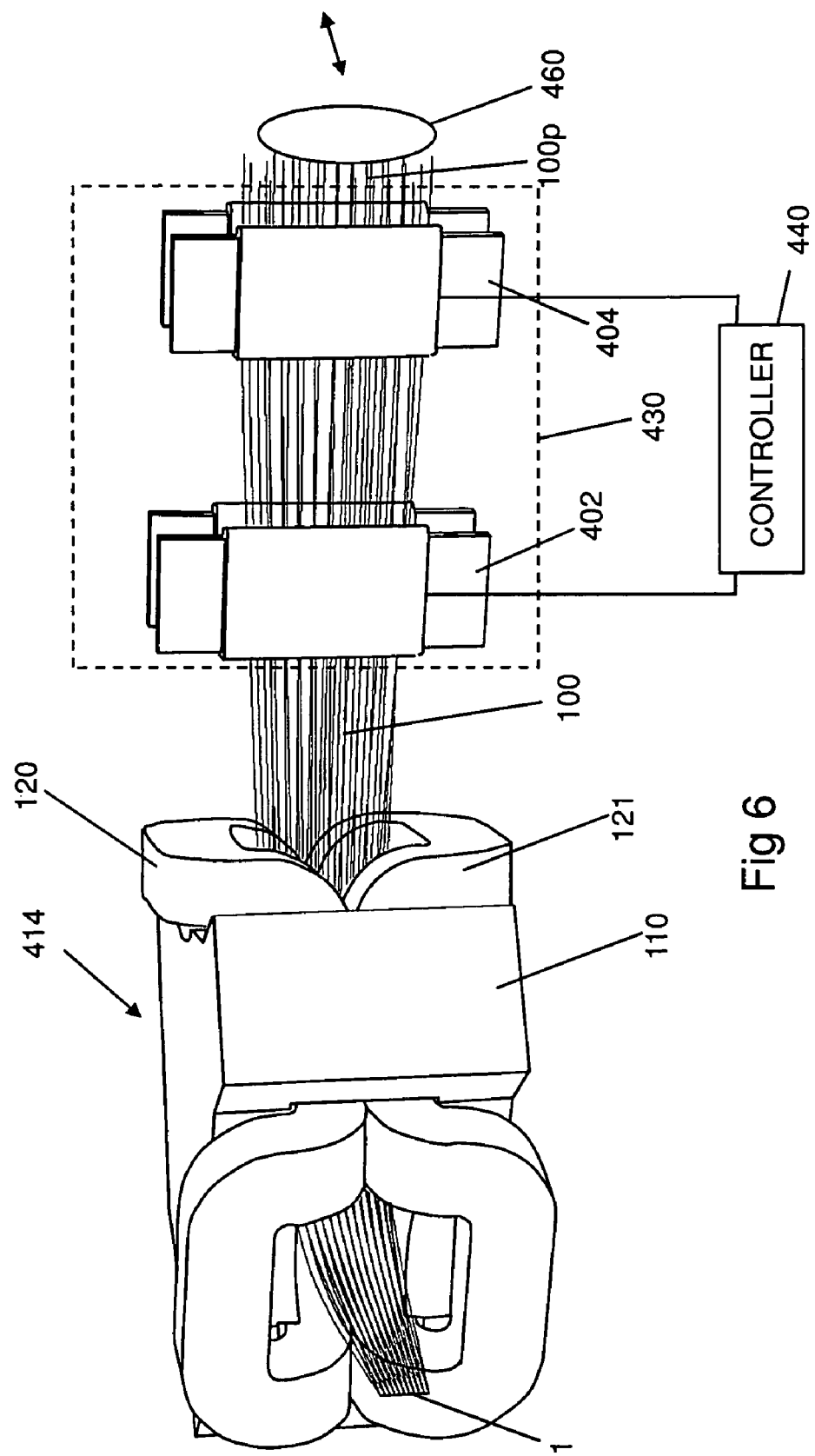
FIG. 6 depicts the use of the embodiment of FIG. 5 to generate a narrow beam taller than the target.
Figure 11:
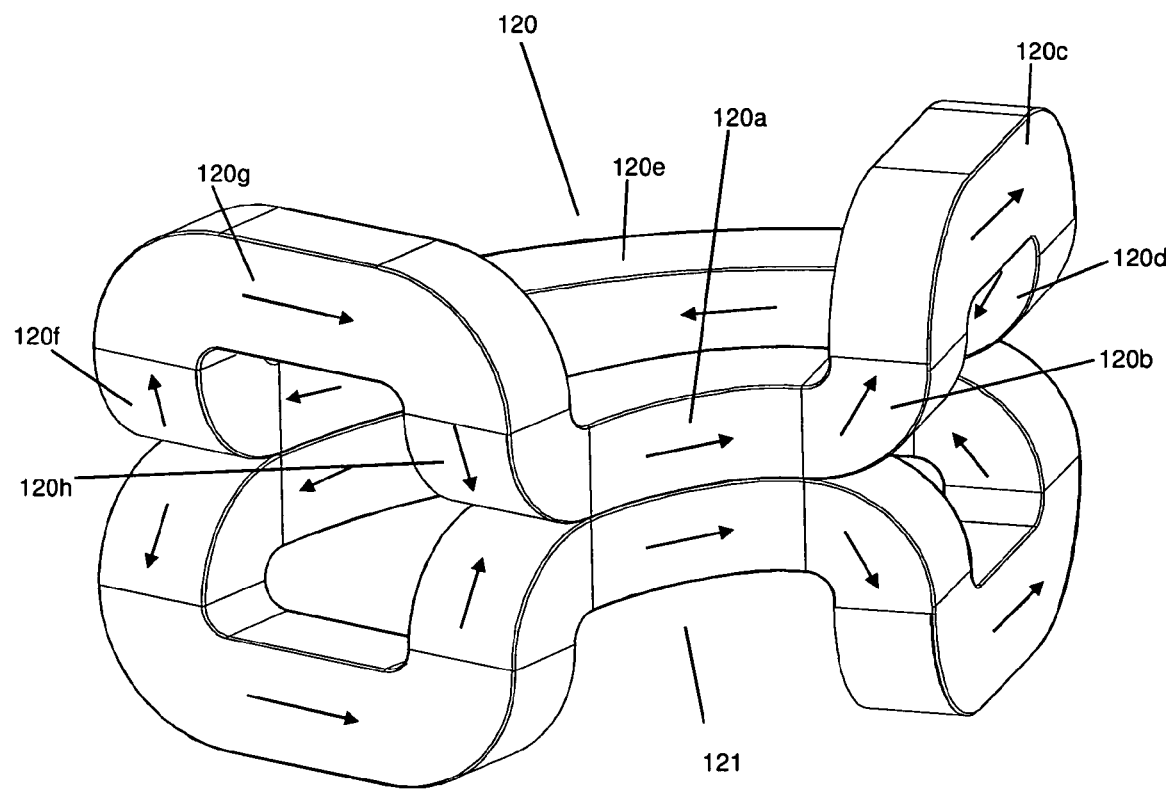
FIG. 11 illustrates the detailed construction of suitable analyzer magnet coils.

A preferred embodiment of mass analyzer magnet 414 is shown in both perspective views in FIGS. 6 and 11 and in cross-sections in FIGS. 4a through 4c. The magnet comprises an arcuate yoke 110 of a ferromagnetic material and upper and lower coils 120 and 121. The yoke and coils encompass a pathway for the ion beam that is curvilinear with a radius of curvature in a range between 0.25 and 2 meters and an arc of curvature ranging from not less than about 45 degrees to not more than about 110 degrees. The yoke has a generally rectangular cross-section with a top and bottom positioned at equal distances above and below the intended beam path, and vertical sides enclosing a spatial volume encompassing the intended beam path. Coils 120 and 121 are saddle-shaped (also called bedstead-shaped) and are mirror images of one another in the mid-plane. The magnetic field required to bend the ion beam is generated by current passing through the two coils. The direction of the magnetic field is generally vertical, and the magnetic field lines terminate on the top and bottom portion of the yoke normal to the inside surfaces thereof.

Each of coils 120, 121 comprises a winding or windings of conductive wire which is wound to fill an envelope of rectangular cross section which follows a three dimensional path. As shown in detail in FIG. 11, the path of upper coil 120 comprises multiple segments as follows:

a segment 120a commencing to the right of the intended beam axis at the entrance of yoke 310, taking a arcuate path generally parallel with the intended beam axis to the exit of the yoke, passing between a sidewall of the yoke and the intended beam path, a segment 120b curving approximately 90 degrees upwards, a segment 120c arching to the left over the top of the beam path through approximately 180 degrees close to the exit of the yoke (this segment may optionally be subdivided into two arc-shaped segments and a straight section), a segment 120d curving through approximately 90 degrees towards the exit of the yoke, a segment 120e commencing at the exit of the yoke and taking an arcuate path generally parallel to the intended beam axis as far as the entrance of the yoke, in the opposite direction to the intended travel of the beam, passing between a sidewall of the yoke and the intended beam path, a segment 120f curving upwards through approximately 90 degrees, a segment 120g arching to the right over the top of the beam path through approximately 180 degrees close to the entrance of the yoke (this segment may optionally be subdivided into two arc-shaped segments and a straight section), and a segment 102h curving 90 degrees towards the entrance of the yoke, and joining onto the beginning of the path of the coil envelope, so as to complete a circuit.

As noted above, the lower coil is a mirror image of the upper coil. Thus, the pair of saddle-shaped coils: (i) presents a bend direction for the two rounded inclined ends of one looped-shaped coil which is opposite to the bend direction for the two rounded inclined ends of the other looped-shaped coil in the array, (ii) provides a central open spatial channel via the cavity volume of the closed loop in each of the two coils, said central open spatial channel extending from each of said inclined loop ends to the other over the linear dimensional distance of the array, (iii) is positioned within said internal spatial region along the interior surfaces of two opposing walls of said arcuate yoke construct such that one pair of aligned rounded inclined loop ends extends from and lies adjacent to each of the two open ends of said arcuate yoke construct, and (iv) serves as limiting boundaries for said curvilinear central axis and intended arc pathway for the continuous ribbon ion beam as it travels in the gap space existing between said two loop-shaped coils positioned within said internal spatial region of said arcuate yoke construct.

The rectangular envelope along the path so described is filled by winding a predetermined number of turns of conductor along it. The coil so formed may optionally be impregnated with resin to form a rigid body. The lower coil is formed in a similar way to the upper coil. Both coils may be connected in series to a source of current, or two sources of current, one for each coil, may be used, or the coils may be subdivided and connected to individual sources of current. The arcuate part of the intended beam path is enclosed on the left and right by segments of the upper and lower coils, and at the top and bottom by steel parts of the yoke. The effect of passing electrical current through the coil is to generate a substantially uniform vertically oriented magnetic field within the enclosed volume bounded by the coils and the top and bottom of the yoke, and to provide regions at the entrance and exit in which the magnetic field falls rapidly with distance from the yoke to a near zero value. The magnetic field as a whole is effective to deflect a ribbon-shaped ion beam along an intended path, and through an aperture, rejecting contaminants. The mid-plane of the magnet 214 and the non-dispersive plane extends from the ion source to the target perpendicular to the dispersive plane.

Figure 7:
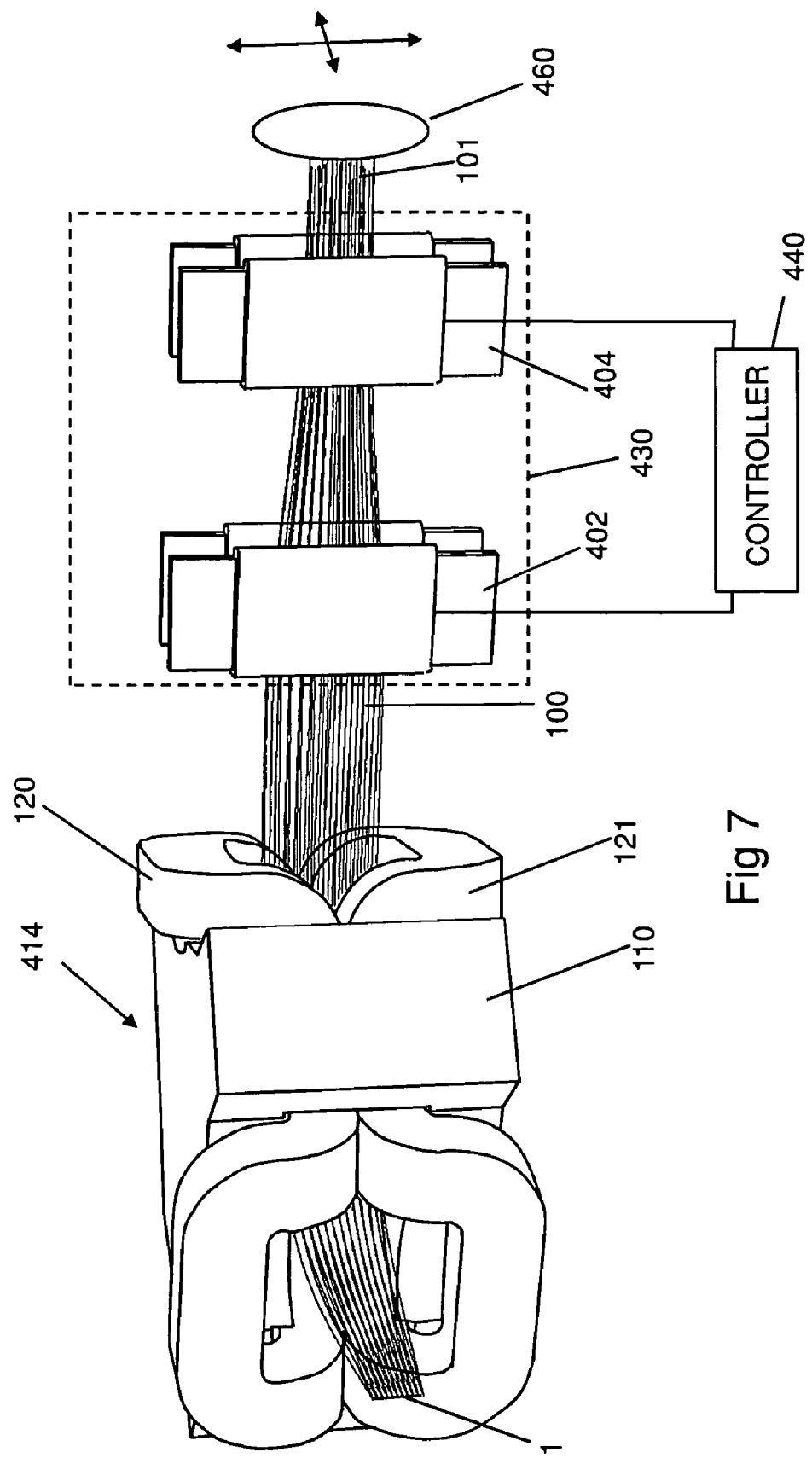
FIG. 7 depicts the use of the embodiment of FIG. 5 to generate a spot beam smaller than the target.
Figure 12:
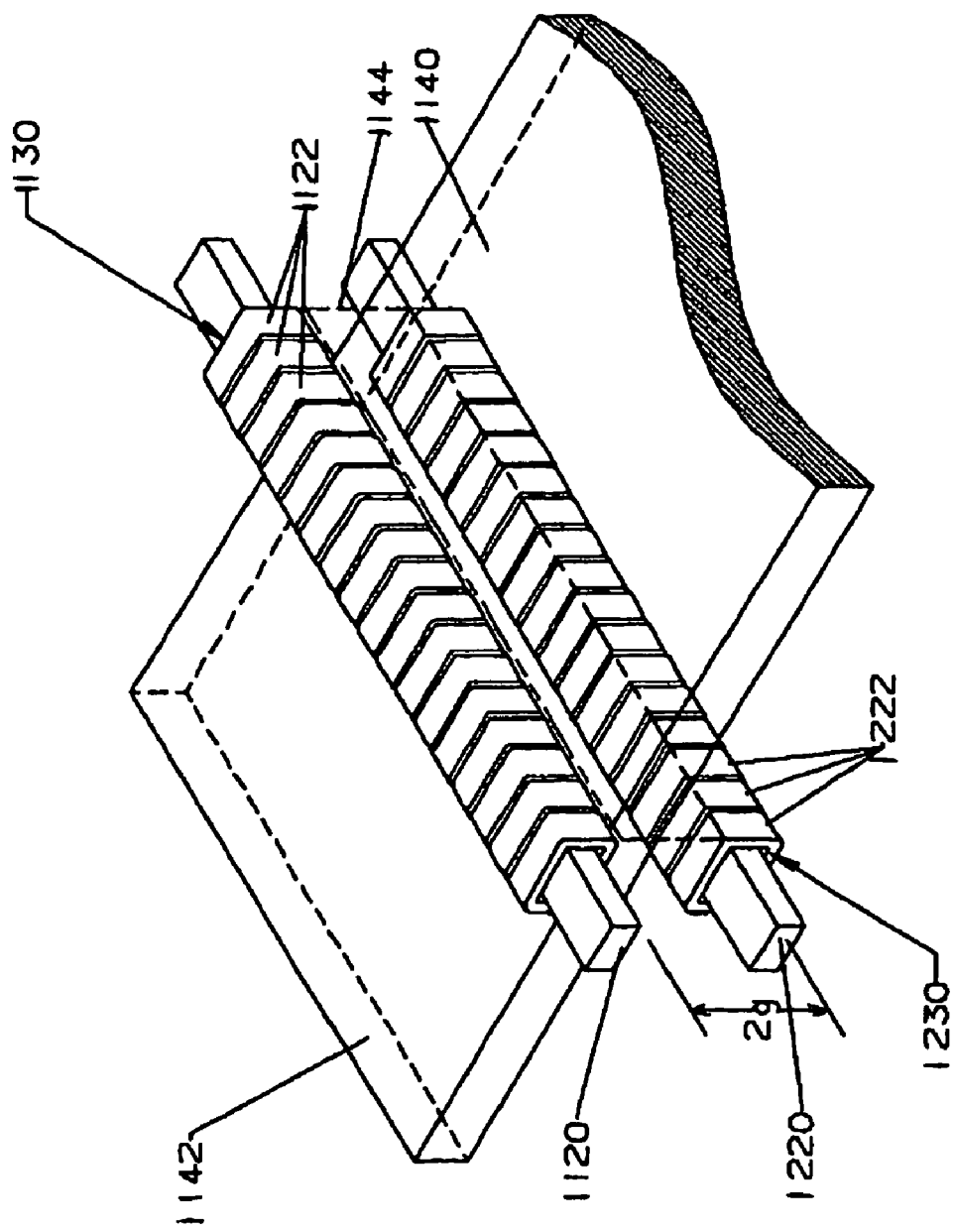
FIG. 12 illustrates the detailed construction of a multipole lens.

A preferred embodiment of collimator lens 200 is shown in FIG. 12 which is adapted from FIG. 7 of U.S. patent application Ser. No. 10/807,770, filed Mar. 24, 2004, now U.S. Patent Application Publication No. 2005/0017202 for "Electromagnetic Regulator Assembly for Adjusting and Controlling the Current Uniformity of Continuous Ion Beams." This application is incorporated herein by reference in its entirety. As shown in FIG. 12, collimator lens 200 comprises two ferromagnetic bars 1120 and 1220, each of which is sized to be somewhat longer in linear length than the x-dimension of the traveling ion beam intended to be controlled; and is oriented to lie parallel to and at a pre-chosen gap distance 1144 from one another. Each ferromagnetic bar 1120 and 1220 serves as a straight supporting rod around which a plurality of individual wire coils 1122 and 1222 are orthogonally wound at a number of predetermined and different locations; and collectively create an axially aligned series of independent, separated, and adjacently located coiled windings.

A component part of the collimator lens is on-demand means (not shown) for introducing electrical energy of variable current (amperes) independently through each independent and adjacently positioned wire coil 1122 and 1222 which is orthogonally disposed along the fixed length of the support rods 1120 and 1220. Given the flow of electrical energy of an appropriate current, each adjacently positioned and energized wire coil 1122 and 1222 independently generates an orthogonally extending and individually adjustable magnetic field gradient of limited breadth; and the plurality of adjacently extending magnetic field gradients of limited breadth collectively merge to form a contiguous magnetic field; and the strength of each magnetic field of limited breadth within the contiguous magnetic field can be individually altered at will by varying the electrical current to yield an adjustable and controllable magnetic field gradient over the contiguous magnetic field.

In particular, as illustrated in FIGS. 2 and 3 of the '770 application and as described in conjunction with FIGS. 6 and 7 below, the windings 1122, 1222 can be selectively excited so as to alter the shape and/or uniformity of the ion beam. Thus, the current density profile of the ion beam can be altered so as to produce at a workpiece a beam profile approximating any one of the following profiles: [0061] a uniform profile extending across a dimension of the workpiece; [0062] a Gaussian profile or other desired profile; [0063] a linearly varying profile extending across a dimension of the workpiece or [0064] any other pre-defined beam profile useful in an ion beam process. Moreover, in the case of the Gaussian beam profile and other profiles for which measures such as half-width have meaning, the half-width for the beam profile can be controlled.

Figure 5A:
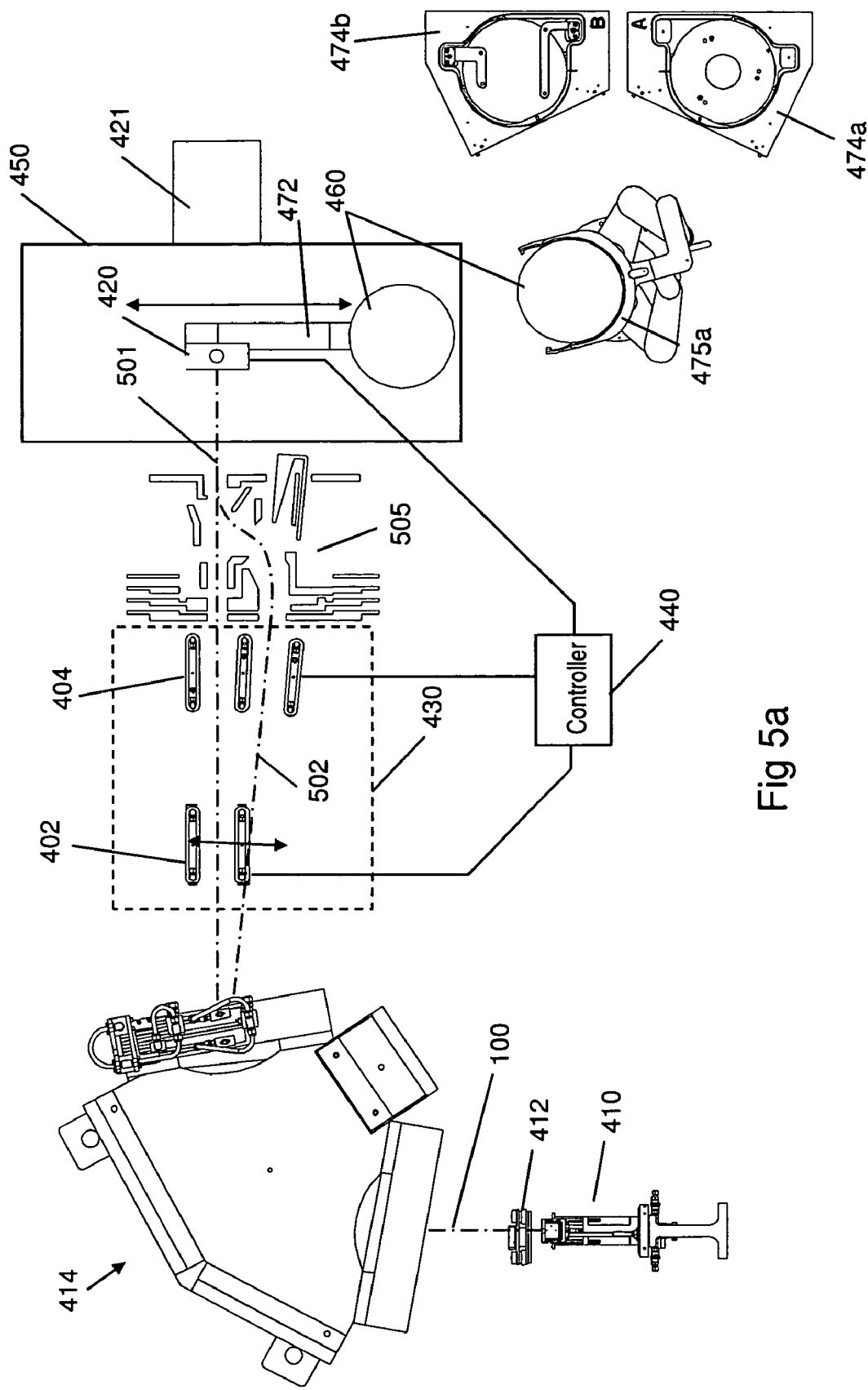
FIG. 5a illustrates an embodiment of the invention in which two multipole lenses follow the analyzer magnet, and the beam has two possible paths, one path passing through an s-bend where it is decelerated to reach very low energies (or accelerated to higher energies) without contamination by high-energy neutral atoms or ions.

In a preferred embodiment of the invention shown in FIG. 5a, the ion implantation system comprises an ion source 410, extraction optics 412, an analyzer magnet 414, a focusing system 430, a controller 440, a target chamber 450 and a wafer transport system 475. The implantation system also comprises beam dumps 505 for absorbing unwanted ions and a Faraday beam profile measurement system 420 located in target chamber 450.

The ion source 410 preferably is a Bernas-type ion source and the extraction optics have a slightly convex shape. Mass analyzer magnet preferably is the same as that of the system of FIG. 3 which is described in detail in paragraphs 0035 to 0038 above. The focusing system 430 further comprises a first set of multipole magnets 402 and a second set of multipole magnets 404. Each set of multipole magnets has a construction similar to that of collimator lens 200 of the system of FIG. 3. The construction of such multipole magnets is described in more detail in paragraphs 0039 to 0041 above and in the above-referenced U.S. patent application Ser. No. 10/807, 770. The operation of the focusing system is described below in paragraphs 0048 to 0052. Target chamber 450 (FIG. 5a) also includes an electrostatic chuck 471 and a translation stage for moving the mounting in two directions. In FIG. 5a, these directions typically are up and down relative to the mid-plane (i.e., in and out of the plane of paper) and left and right of the non-dispersive plane (i.e., up and down in the plane of the paper). The wafer transport system 475 further comprises load locks 474a and 474b, and a robot arm 475a for moving a wafer from one load lock to the transport mechanism for ion implantation and for moving an implanted wafer from the transport mechanism to a load lock.

Figure 8:
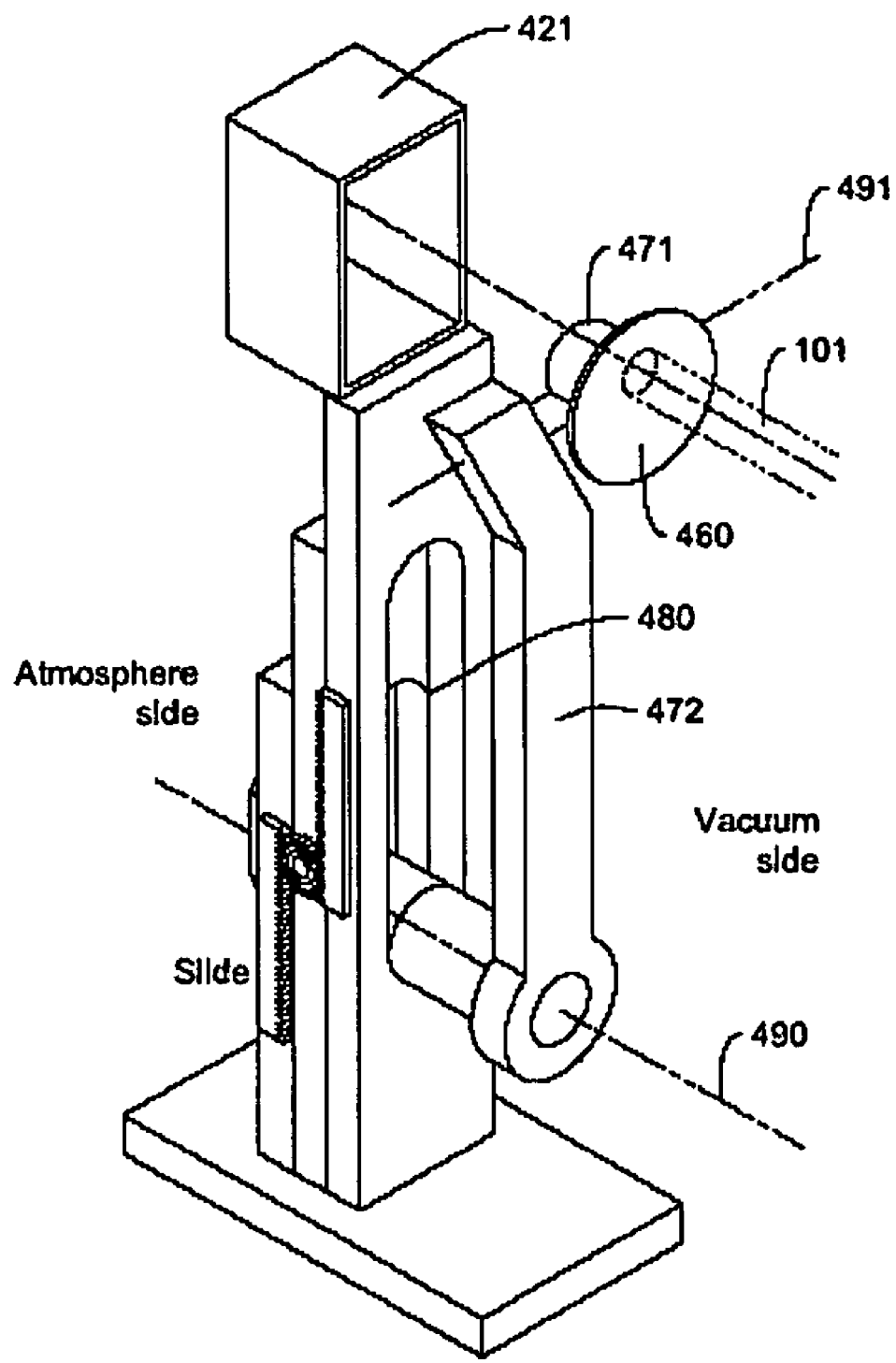
FIG. 8 illustrates an apparatus for scanning the target through the ion beam in either 1 or 2 dimensions.
Figure 10:
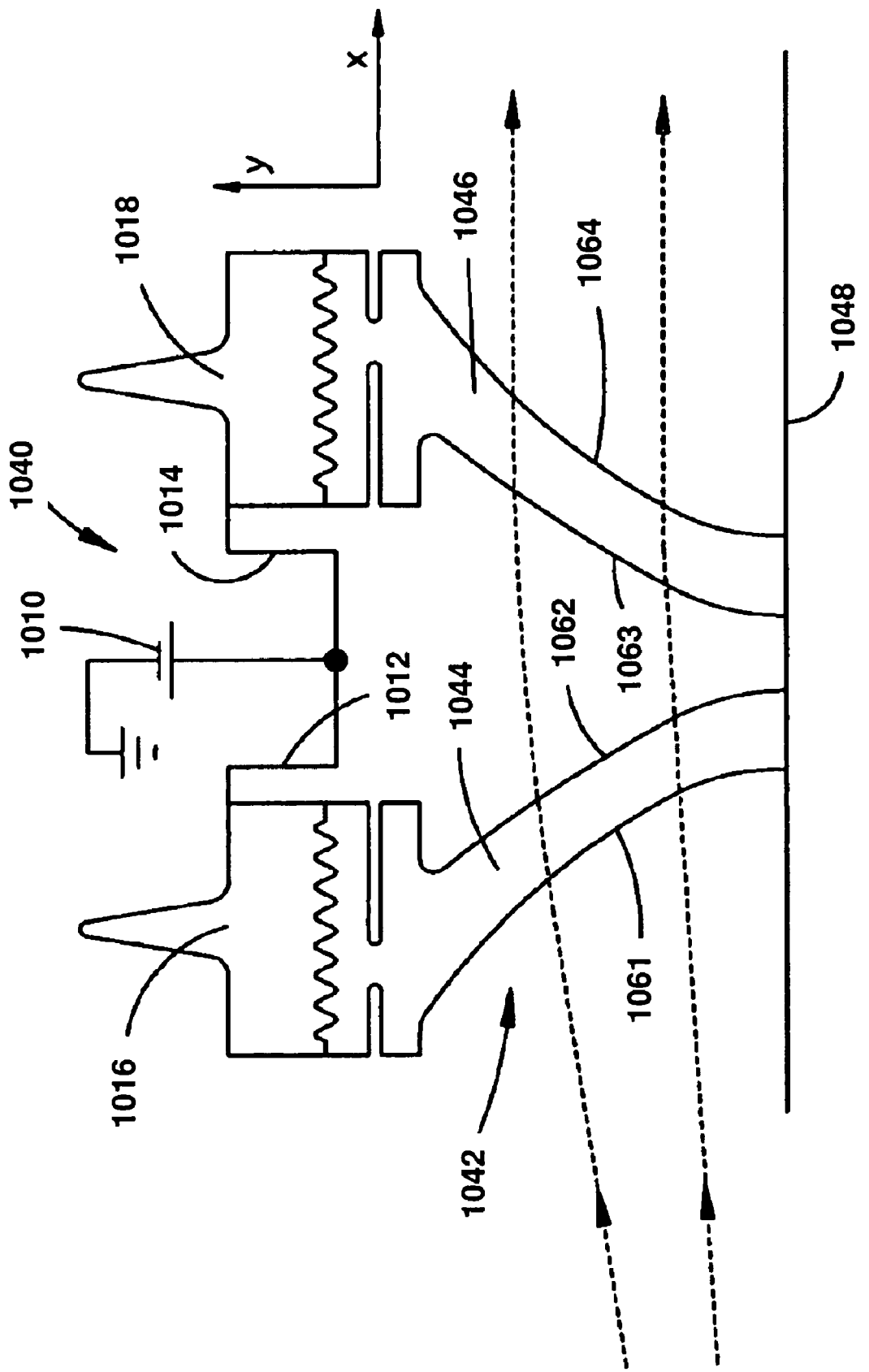
FIG. 10 illustrates an alternative prior art electrostatic lens that could be used in this invention for controlling the collimation of the ion beam.

Further details of a preferred mechanical two-dimensional scanning system for the workpiece are shown in FIG. 8 which is adapted from FIG. 10 of U.S. Pat. No. 7,057,192 which is incorporated by reference herein in its entirety. An electrostatic chuck 471 for the workpiece 460 is mounted on an arm 472, and the arm is pivoted about a horizontal axis 490, situated 900 mm in this instance from the center of the workpiece, and parallel to the beam axis 501. With the arm swung to position the chuck at one side of the ion beam path, a second axis of rotation allows the chuck to pivot to a horizontal position, allowing a robot arm 475a to transfer workpieces off and on the chuck from loadports 474a or 474b. Once a workpiece is loaded onto the chuck, the chuck is rotated about the horizontal axis 490 until the normal to the workpiece surface is at a predetermined angle to the beam axis 501 (commonly 0.degree.).

If a ribbon beam is used, the height of the arm is adjusted by a linear motor (not shown) sliding the mechanism along a sliding seal 480, until the workpiece trajectory is centered on the beam, at which point the arm can be rotated at a controlled velocity about axis 490, back and forth as required, passing the workpiece through the ribbon beam to implant a desired dose of ions into the workpiece.

To carry out an implant with a two-dimensional scan, the arm is moved to the bottom of its travel on sliding seal 480, then its height is increased progressively as the arm is pivoted to and fro to pass the workpiece through the beam (which is focused to a spot smaller than the workpiece in this case) in a curved zig-zag pattern, so as to implant a uniform dose of ions into the workpiece.

In operating the system of FIG. 5a, the Bernas-type ion source 410 is used to produce an ion beam 400 that is much taller than it is wide. A set of extraction optics 412 is used to extract the ion beam by applying a relative negative potential on the first electrode. The emergent beam has slightly divergent ray paths with respect to the non-dispersive plane of the magnet 414. As a result, a ribbon-shaped beam is produced having a rectangular cross-section with a longer dimension that lies in the non-dispersive plane. The ion beam is directed into mass analyzer magnet 414 which selects the desired ions with the appropriate charge to mass ratio. The desired ions then traverse the first set of multipole magnets 402 that is controlled in either open or closed loop operation via feedback from the Faraday beam profile measurement system 420. The first set of multipole magnets 402 is operated in response to a measurement of the beam profile by Faraday measurement system 420 to control the size and current density profile of the beam to insure that the amount of total ion dose rate per unit height will be uniform at the point of use, i.e. the target wafer 460. To do this, the coils of the first set of multipole magnets generate an overall quadrupole field with superimposed controllable regions of field gradient. After the ion beam passes through the first set of multipole magnets 402, it continues along the beam path to the second set of multipole magnets 404. The coils of the second set of multipole magnets can also be used to generate a quadrupole field that as described below is suitable for collimation of the ion beam in the non-dispersive plane of the analyzer magnet 414, thereby canceling the divergence or convergence of the ion beam. The coils of the second set of magnets can also be used to superimpose further controllable regions of field gradient to reduce angular variations in the beam, including variations generated by the first set of magnets 402. The desired ions pass through a selected gap between the poles of this lens; and beam dumps 505 of a suitable material block all other paths for any stray beam ions, so that only the desired ions can reach the target chamber 450. The target 460 can be mechanically scanned in a direction perpendicular to the beam and in the plane of the paper so as to provide uniform implantation coverage of the target.

Figure 5B:
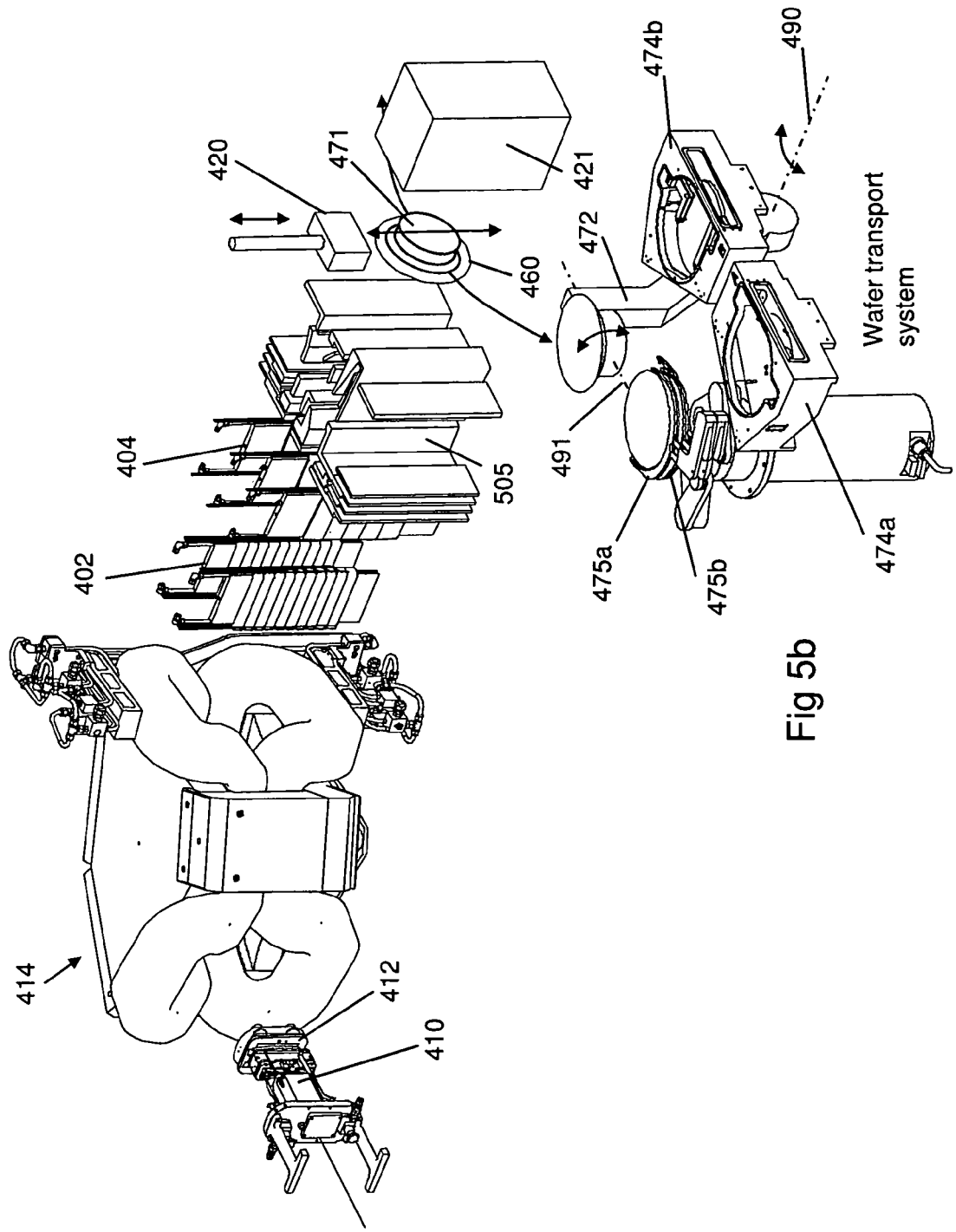
FIG. 5b is a perspective view of the system of FIG. 5a, showing that the scan system is capable of moving the target workpiece in two dimensions through the beam path.

The ion implantation system of FIGS. 5a and 5b can be operated in two modes depicted in FIGS. 6 and 7. FIGS. 6 and 7 depict the system of FIGS. 5a and 5b in greatly simplified form for ease in understanding this aspect of the invention. Specifically, only mass analyzing magnet 414, focusing system 430 with the first and second sets of multipole magnets 402, 404, controller 440, and target 460 are shown.

In the first mode of operation illustrated in FIG. 6, the ion beam is allowed to continue as a ribbon-shaped beam whose major dimension exceeds a dimension of the workpiece. Thus, focusing lens 430 is operated in the first mode so that the ion beam is allowed to expand until it reaches a size greater than that of target 460. The currents in the coils of the second set of multipole magnets 404 are controlled responsive to a measurement of the ion beam profile to control the current density in this beam profile. In particular, the currents are used to collimate the ion beam so that the ions in the beam are substantially parallel as the beam is directed onto the target 460 in chamber 450. The workpiece is translated through this ion beam along a single path, one or more times, to implant a desired uniform dose of ions into its surface. Illustratively, the workpiece may simply be moved laterally through the beam, as illustrated by the arrows in FIG. 6. However, in the embodiment shown in FIGS. 5a and 5b, it is moved on an arc-shaped path, and this requires that the beam uniformity be controlled so that the current density within the beam is proportional to the local scan velocity of the target workpiece, which is proportional to distance from the pivot axis of the arm.

While implant operations with such a ribbon beam provide high throughput in an ion implantation operation, it is difficult if not impossible to ensure adequate uniformity of the ion beam at high currents and extremely low ion energies such as those needed in the manufacture of modern integrated circuits. In particular, for currents in excess of 1 mA and ion energies less than about 3 keV, even with care to establish space-charge neutralization, space charge effects can cause enough disruption of the ion beam to make it impossible to assure that a ribbon beam has the uniformity required for ion implantation of semiconductor wafers.

In this situation, focusing lens system 430 is operated in a second mode illustrated in FIG. 7 so as to focus the ion beam to a smaller cross-section beam 701 than the implant target. More particularly, in the second mode, the currents in the coils of the first set of multipole magnets 402 are excited so as to generate a quadrupole magnetic field which causes the ribbon ion beam to converge in its major dimension, thereby generating at a downstream location a beam spot which is smaller in both transverse dimensions than either dimension of the target workpiece 460. Again, the second set of multipole magnets 404 is used to reduce the range of angular variation in the ion beam. In the second mode of operation, the workpiece is translated in a reciprocating path in two dimensions through the ion beam, so as to implant a uniform dose of ions into its surface. Illustratively, the target is scanned in two dimensions both up and down relative to the mid-plane and left and right across the non-dispersive plane to ensure that the reduced size ion beam irradiates the entire semiconductor wafer target.

Advantageously, the two modes of operation of the multipole lens are achieved by applying different currents to the individual coils of the sets of magnets 402, 404 under control of a system controller 440. Simultaneously, the controller also controls the operation of the translation stage so as to provide for a one-dimensional or two-dimensional scan.

A preferred embodiment of the invention uses alternative ion beam paths 501, 502 after the analyzing magnet, as shown in FIG. 5a. Such paths facilitate the delivery of higher beam currents at lower energies for ion implantation in either mode of operation of focusing system 430. The analyzer magnet is adjusted to deflect the ion beam from its initial axis 501 through an additional five degrees onto axis 502, which can be seen to incorporate an s-bend and re-merge with axis 501. In the course of passing along this axis, the ion beam is decelerated to a predetermined energy in the approximate range from 3% to 20% of the initial energy. To accommodate this change, the first set of multipole magnets 402 can be moved on a track as indicated by arrow 403 to be centered on this modified beam axis 502, and where the ion beam passes through the second set of multipole magnets 404 a second beam channel is provided, in which the direction of the magnetic field is conveniently reversed from its direction on axis 501. Other methods and variations of this method of providing for a suitable second beam path are also envisioned.

Figure 9A:
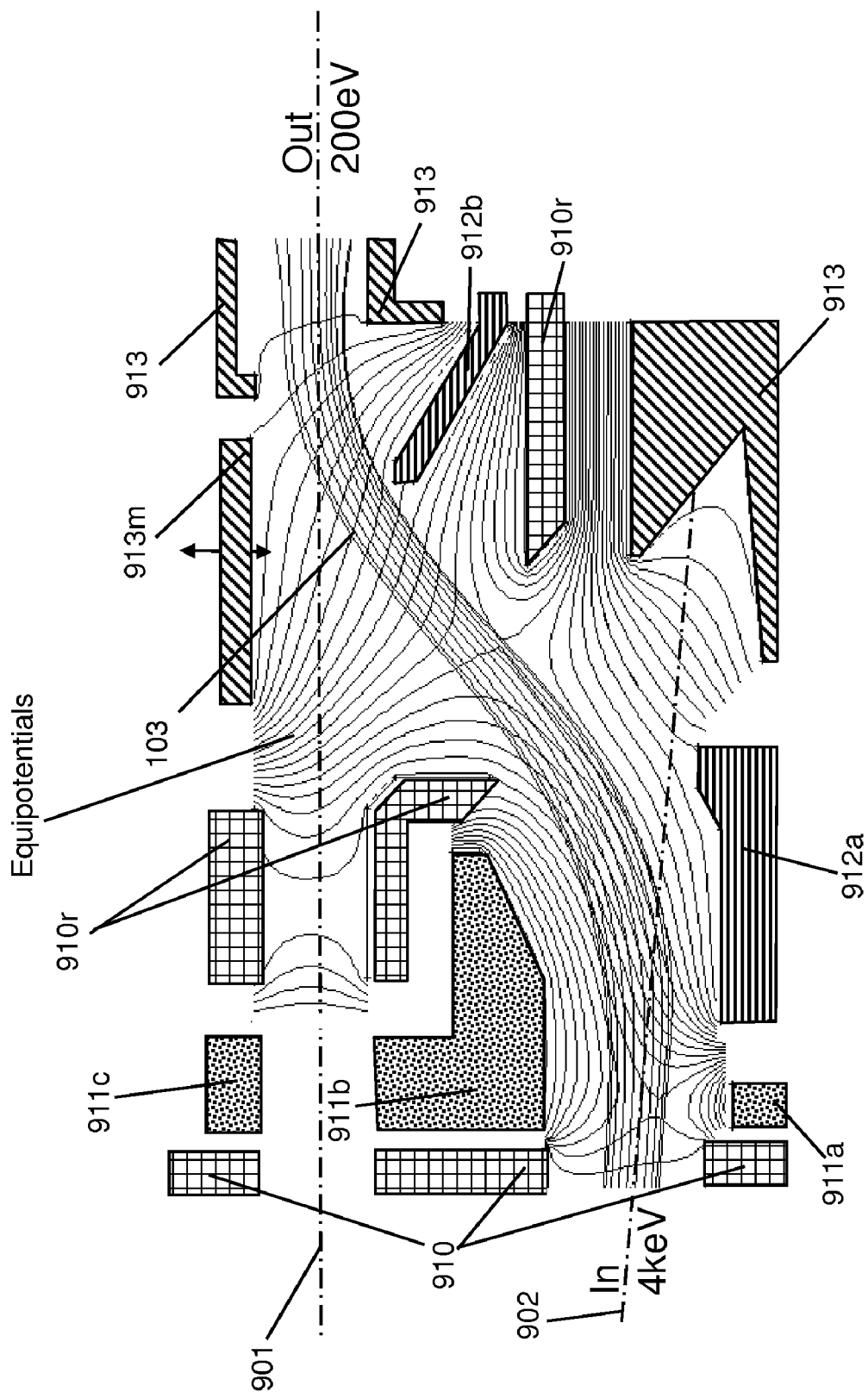
FIG. 9a depicts the details of an s-shaped deceleration region used in the system of FIGS. 5a and 5b.

After passing through these focusing devices, the beam passes through a short region of accelerating electric field prior to being decelerated. As shown in greater detail in FIG. 9a, a first set of electrodes 910 defines the initial energy, a second set of electrodes 911a-c is at a more negative voltage to suppress electrons, a third set of electrodes 912a, 912b is at an intermediate positive potential and a fourth set of electrodes 913 is at the final potential. Ion beam paths 901 and 902 of FIG. 9a correspond to ion beam paths 501 and 502 of FIG. 5a. Illustratively, in FIG. 9a, a 10 mA beam of boron ions is initially traveling at 4 keV. The suppression potential is approximately-3 keV, and the potential difference between electrodes 910 and 913 is 3800V.

The function of the negative suppression potential on electrodes 911*a-c* is well-known: to prevent electrons within the ion beam from being accelerated in the ion deceleration region. Following the suppression region, a positively biased electrode 912*a* is placed on one side of the ion beam. It has two functions: to create a deflection field, and to raise the potential on the beam axis, thereby partially decelerating the beam. After the beam has been deflected left through about 20 degrees it passes through a restricting aperture formed by electrodes 910*r*. The amount that the beam is deflected can be adjusted and controlled by varying the suppression potential on electrodes 911*a* and 911*b*. After passing though this aperture, the beam is strong decelerated while being deflected to the right, so as to merge with the initial beam path. The final beam energy is defined by the potential between the ion source and the implant target. The final electrodes 913 are at the potential of the implant target, but are shaped so as to create a bending field as well as deceleration. Electrode 913*m* is movable as indicated by the arrows, and adjustment of its position is useful in adjusting the ion beam to precisely merge with the original beam axis 901, but at a small fraction of the original energy. Neutral atoms within the ion beam upon arrival at the deceleration structure are not deflected and are collected in a neutral beam dump. Ions which undergo charge exchange while passing through this s-bend structure will largely also exit the beam. Upon exiting the structure of FIG. 9, there is only a short, small region in which it is possible to charge-exchange an ion in a manner that would permit it to reach the wafer.

Experimentally it has been found that a) the level of energy contamination within a 200 to 500 eV ion beam may be reduced below 0.05%, b) the maximum energy present within this beam is no more than double the final energy although the beam may have been decelerated from an energy 10 to 20 times the final energy, and c) beam currents of almost pure low energy beams are many times greater than those currently available from other types of implantation equipment.

A similar setup can be applied to accelerate ion beams. If the apparatus of FIG. 10 is substituted for that of FIG. 11, the beam will be accelerated while being deflected through an S-bend, which will remove unwanted energy contaminants. In commercial equipment it has commonly arisen that it is convenient to generate and analyze ion beams between energies of approximately 5 and 40 keV, and to reach higher energies, up to 220 keV, a second acceleration stage is used. The apparatus of FIG. 10 is usable to accelerate a beam through this energy range.

When the beam is accelerated, a suppression potential must be the penultimate potential that the ion beam encounters; whereas when it is decelerated, the suppression potential should be the first encountered after the starting potential. Thus a single set of electrodes intended to accomplish either acceleration or deceleration must make provision in tow locations for applying a suppression potential.

The angle through which a beam can be deflected by a given zone of transverse electric field is inversely proportional to the initial energy. Therefore acceleration according to FIG. 10 requires a greater distance than deceleration, since the desired final energy is much greater. The general scheme is similar, but more readily understood.

The acceleration is accomplished in three zones. The first zone deflects the beam to the left (although any orientation may be substituted) while raising the energy to an intermediate value. The second zone deflects the beam to the right (or the opposite direction to the first zone), while raising the energy slightly above the desired final value, and establishing the final direction. The final zone slightly decelerates the beam to achieve the final energy. This final zone according to well-established practice suppresses electrons in the beam from being accelerated in the opposite direction. The intermediate energy is usually close to the geometric mean of the initial and final energies, though its exact value will depend on the specific electrode shapes.

In the first zone, an electrode on the left of the beam is at the intermediate voltage, negative with respect to the initial beam potential, while that on the right is at the initial potential at which the beam enters the apparatus. Thus the beam is deflected to the left while being accelerated to the intermediate energy. Upon reaching the intermediate energy a short electrode on the right is optionally set to the intermediate potential. The shape of the electrode at the initial potential is preferably as shown and will strike the electrode at normal incidence. This minimizes production and acceleration of secondary particles, and prevents them passing directly downstream in the beam.

In the second zone, an electrode on the right of the beam is placed at a potential algebraically equal to the final potential plus a suppression potential, both potentials being negative if the ion beam is composed of positive ions, as is assumed here to be the case. Therefore this potential is the most negative in the system. This potential generates an electric field deflecting the beam to the right while further accelerating it. A short electrode on the left of the beam at this suppression potential terminates the region of transverse field.

Finally the beam is slightly decelerated, the potential of the final electrode(s) being commonly that of local ground. In this embodiment, the energy of the beam is raised beyond the desired final energy, then retarded to the final energy in a short, approximately straight, final decelerating gap. The beam is now at its final potential. The function of this deceleration is to electrostatically block electrons within the beam in its final field-free region before striking its target from being accelerated in the opposite direction. As is well-known, there are at least two reasons for trapping electrons in this beam—the prevention of beam blow-up, and the minimization of charging of the surface of the target.

Most ions or atoms of unwanted energies will leave the beam to strike the walls, which are shaped to prevent sputtered particles traveling downstream.

A preferred embodiment of this aspect of the invention uses alternative ion beam paths 501, 502 after the analyzing magnet, as similar to those shown in FIG. 5*a*. The analyzer magnet is adjusted to deflect the ion beam from its initial axis 501 through an additional five degrees onto axis 502, which can be seen to incorporate an s-bend and re-emerge with axis 501. In the course of passing along this axis, the ion beam is accelerated to a predetermined energy in the approximate range from 4 to 20 times of the initial energy.

Figure 9B:
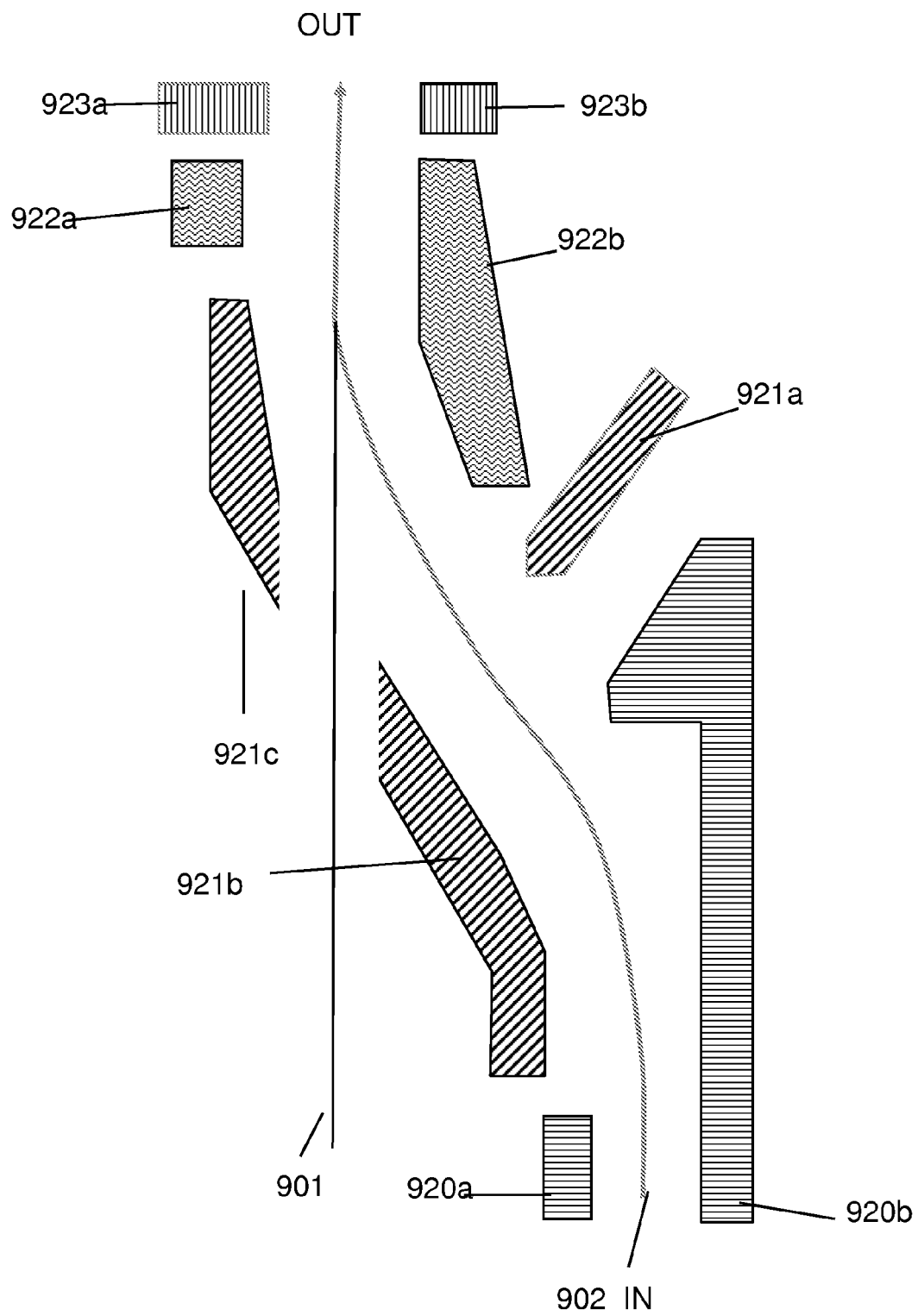

As shown in greater detail in FIG. 9*b*, a first set of electrodes 920 defines the initial energy, a second set of electrodes 921*a-c* is at an intermediate potential, a third set of electrodes 922*a* and 922*b* is at the most negative potential, in part to suppress electrons, and fourth set of electrodes 923*a* and 923*b* is at the final potential that is usually at a potential of the workpiece. Ion beam paths 901 and 902 of FIG. 9*b* correspond to ion beam paths 501 and 502 of FIG. 5*a*. The suppression potential is approximately 3 keV, and the potential differences between electrodes 920 and 923 are in ranges of positive 10,000 to 160,000V.

Given a desired acceleration voltage, the intermediate voltage on electrodes 921*a-c* is adjusted to achieve a suitable initial deflection, then the suppression voltage is adjusted to correct the final direction. The device will work best when the ratio of initial to final energy is in a certain range determined by the physical proportions of the device. This range could be extended by the addition of additional electrodes to provide a degree of separation between the transverse and the accelerating field components.

The use of this s-bend acceleration or deceleration in the second mode of the beamline means that 2-dimensional scanning may be used to obtain a uniform implant dose and that simultaneous accurate control of the uniformity of the ribbon beam is no longer necessary.

Another embodiment of this invention uses electrostatic lenses instead of magnetic lenses in focusing system 430 to collimate or focus the ion beam. An example of such lenses is shown in FIG. 10 which is adapted from FIG. 2 of U.S. patent publication 2004/0262542 A2 which is incorporated herein by reference. A first pair of electrodes 1061, 1062 establish a first voltage gap and a second pair of electrodes 1063, 1064 establish a second voltage gap. Slot-shaped openings in the electrodes allow an ion beam 1048 to pass through. As described more fully in paragraphs 0021 and 0022 of the '542 publication, the action of the electric fields set up by the electrodes cause ions that enter the lens to exit the lens on trajectories generally parallel to axis 1048.

The ion implantation system of this invention has significant advantages over prior art ion implantation systems. Serial-mode implantation is preferable to batch-mode for throughput considerations and reduced risk in product loss in the event of machine failure. Serial ion implantation systems also have much simpler and less expensive wafer handling systems so that development, manufacturing, and operating costs are lower than batch-mode systems. By implementing the system design and configuration of this invention, equipment suppliers can meet the challenge of making a serial machine for implantation applications that is reliable and has competitive process control capability. Furthermore, the system configuration as now taught by this invention involves relatively few components compared to other serial high current methods, which have yet to achieve any notable success. Currently batch mode machines are filling the high current implanter niche but this invention provides a superior product to the semiconductor industry, especially for low energy and 300 mm applications.

In addition to ion implantation, the process and apparatus of the present invention may also be used for film coating or carrying out other types of surface processing applications. As the beam is projected as a divergent beam with small divergent angle, a highly uniform beam density is provided for implantation or depositing particles to achieve higher level of uniformity as the expanded beam reaches the target surface. As a result, the invention finds application for deposition on a surface to form optical filter coatings or for different types of surface processing functions on glass, metals or a wide variety of materials.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method of accelerating an ion beam having an initial energy to a final higher energy and final direction while substantially eliminating contaminant ions and neutral atoms having energies other than the final energy, the method comprising:
   generating a beam of ions at an initial energy, guiding the ion beam along an ion beam path;
   controlling and adjusting the electrostatic potential and electric fields along the beam path so as to cause the ion beam to follow a generally s-shaped path while being accelerated, so that the ions in the ion beam are accelerated to the final energy and a centroid of the beam after acceleration travels generally in the final direction; and
   intercepting undeflected neutral atoms or molecules and/or charged fragmented molecular ions so as to remove them from the ion beam.

2. The method of claim 1 wherein the beam is deflected by a set of electrodes that provide two opposed successive sideways components on an accelerator field to provide the generally s-shaped path.

3. The method of claim 2 wherein the deflections each amount to an angle of at least 10 degrees.

4. The method of claim 1 wherein beam stops are utilized to intercept the undeflected ions.

5. The method of claim 1 wherein the energy of the beam is raised beyond the desired final energy, then retarded to the final energy in a short, approximately straight, final decelerating gap.

6. A method of decelerating an ion beam having an initial energy to a final higher energy and final direction while substantially eliminating contaminant ions and neutral atoms having energies other than the final energy, the method comprising:
   generating a beam of ions at an initial energy, guiding the ion beam along an ion beam path;
   controlling and adjusting the electrostatic potential and electric fields along the beam path so as to cause the ion beam to follow a generally s-shaped path while being decelerated, so that the ions in the ion beam are decelerated to the final energy and a centroid of the beam after acceleration travels generally in the final direction; and
   intercepting undeflected neutral atoms or molecules and/or charged fragmented molecular ions so as to remove them from the ion beam.

7. The method of claim 6 wherein the beam is deflected by a set of electrodes that provide two opposed successive sideways components on an accelerator field to provide the generally s-shaped path.

8. The method of claim 7 wherein the deflections each amount to an angle of at least 10 degrees.

9. The method of claim 6 wherein beam stops are utilized to intercept the undeflected ions.

10. The method of decelerating an ion beam wherein the energy of the beam is slightly increased prior to deceleration according to the method of claim 6, thereby preventing the acceleration of unwanted particles of opposite charge to the desired ions.

11. A system of accelerating an ion beam having an initial energy to a final higher energy and final direction while substantially eliminating contaminant ions and neutral atoms having energies other than the final energy, the system comprising:
   means for generating a beam of ions at an initial energy, guiding the ion beam along an ion beam path;
   means for controlling and adjusting the electrostatic potential and electric fields along the beam path so as to cause the ion beam to follow a generally s-shaped path while being accelerated, so that the ions in the ion beam are accelerated to the final energy and a centroid of the beam after acceleration travels generally in the final direction; and means for intercepting undeflected neutral atoms or molecules and/or charged fragmented molecular ions so as to remove them from the ion beam.

12. The system of claim 11 wherein the beam is deflected by a set of electrodes that provide two opposed successive sideways components on an accelerator field to provide the generally s-shaped path.

13. The system of claim 12 wherein the deflections each amount to an angle of at least 10 degrees.

14. The system of claim 11 wherein beam stops are utilized to intercept the undeflected ions.

15. The system of claim 11 wherein the energy of the beam is raised beyond the desired final energy, then retarded to the final energy in a short, approximately straight, final decelerating gap.

16. A system of decelerating an ion beam having an initial energy to a final higher energy and final direction while substantially eliminating contaminant ions and neutral atoms having energies other than the final energy, the system comprising:

means for generating a beam of ions at an initial energy, guiding the ion beam along an ion beam path;

means for controlling and adjusting the electrostatic potential and electric fields along the beam path so as to cause the ion beam to follow a generally s-shaped path while being decelerated, so that the ions in the ion beam are decelerated to the final energy and a centroid of the beam after acceleration travels generally in the final direction; and means for intercepting undeflected neutral atoms or molecules and/or charged fragmented molecular ions so as to remove them from the ion beam.

17. The system of claim 16 wherein the beam is deflected by a set of electrodes that provide two opposed successive sideways components on an accelerator field to provide the generally s-shaped path.

18. The system of claim 17 wherein the deflections each amount to an angle of at least 10 degrees.

19. The system of claim 16 wherein beam stops are utilized to intercept the undeflected ions.

20. The system of decelerating an ion beam wherein the energy of the beam is initially raised beyond the desired final energy, then retarded to the final energy gy using the system of claim 16.

21. An ion implantation apparatus comprising:

an ion source, an extraction assembly for extracting an ion beam;

a magnetic analyzer for separating unwanted ion species from a traveling ribbon ion beam; and a target chamber in which is mounted a target for implantation, Illustratively, the target is a semiconductor wafer or flat panel display, which is moved through the beam (optionally back and forth) along a single path; wherein the beam is ribbon shaped, with one dimension many times greater than the other, and the longer dimension is aligned with the non-dispersive plane of the magnetic analyzer.

22. The on implantation apparatus of claim 21 wherein the magnetic analyzer comprises:

central axis and intended arc pathway for a ribbon ion beam as it travels, said central axis having a curvilinear shape;

an arcuate yoke construct encompassing said predetermined curvilinear shaped central axis and surrounding said intended arc pathway for the continuous ribbon ion beam as it travels, said arcuate yoke construct being formed at least in part of a ferromagnetic material and comprising an arcuate wall structure having fixed dimensions and a substantially rectangular cross-section, two discrete open ends which serve as an entrance and exit for the traveling beam, and an internal spatial region of determinable volume which serves as a spatial passageway for the traveling beam; and a mirror symmetrical pair of discrete loop-shaped coils utilized as an aligned array.

23. The on implantation apparatus of claim 22 wherein each discrete coil of the pair in the aligned array (i) is an elongated complete loop comprised at least in part of electrically conductive material, (ii) is an elongated complete loop having two rounded and inclined discrete loop ends, each of which is bent in the same direction, and (iii) is an elongated complete loop formed as a set of multiple conductive segments placed in sequential series wherein each segment lies at a pre-chosen sequence position and individual angle orientation with respect to the central axis and intended arc pathway for the ribbon ion beam as it travels within said internal spatial region of said arcuate yoke construct.

24. The ion implantation apparatus of claim 23 wherein the aligned array of two looped-shaped coils set in mirror symmetry (iv) presents a bend direction for the two rounded inclined ends of one looped-shaped coil which is opposite to the bend direction for the two rounded inclined ends of the other looped-shaped coil in the pair, (v) provides a central open spatial channel via the cavity volume of the closed loop in each of the two coils, said central open spatial channel extending from each pair of inclined rounded loop ends to the other over the linear dimensional distance of the array, (vi) is positioned within said internal spatial region along the interior surfaces of two opposing walls of said arcuate yoke construct such that one pair of oppositely bent inclined loop ends extends from and lies adjacent to each of the two open ends of said arcuate yoke construct, (vii) serves as limiting boundaries for said curvilinear central axis and intended arc pathway for the continuous ribbon ion beam as it travels in the gap space between said two loop-shaped coils after being positioned within said internal spatial region of said arcuate yoke construct.

25. The ion implantation apparatus of claim 22 wherein in order to create a magnetic field with good uniformity, without excessive stray field, the field is generated by at least two coils or symmetric sets of coils, which are of saddle shape, one above and one below the beam, wherein the region of uniform field is bounded by the coil windings.

26. The ion implantation apparatus of claim 22 in which the arc pathway includes, an arc with a radius ranging between about 0.25 and 2 meters, and an angle of curvature ranging from not less than about 45 degrees to not more than about 110 degrees of curvature.

* * * * *